United States Patent [19]

Lien et al.

[11] Patent Number: 4,635,347
[45] Date of Patent: Jan. 13, 1987

[54] METHOD OF FABRICATING TITANIUM SILICIDE GATE ELECTRODES AND INTERCONNECTIONS

[75] Inventors: Jih-Chang Lien; Hsingya A. Wang, both of San Jose, Calif.

[73] Assignee: Advanced Micro Devices, Inc., Sunnyvale, Calif.

[21] Appl. No.: 717,370

[22] Filed: Mar. 29, 1985

[51] Int. Cl.[4] .................... H01L 21/283; H01L 21/88
[52] U.S. Cl. ........................................ 29/591; 29/571; 29/578; 148/1.5; 148/187; 148/DIG. 19; 148/DIG. 147; 156/643; 156/653; 156/657; 357/23.9; 427/88; 427/91
[58] Field of Search ................. 29/571, 578, 591; 148/187, 1.5, DIG. 19, DIG. 147; 156/643, 653, 657; 357/67, 23.9, 23.1; 427/88, 91

[56] References Cited

U.S. PATENT DOCUMENTS

| | | | |
|---|---|---|---|
| 3,753,774 | 8/1973 | Veloric | 148/DIG. 147 |
| 4,080,719 | 3/1978 | Wilting | 29/571 |
| 4,102,733 | 7/1978 | De Lamoneda | 29/578 X |
| 4,332,839 | 6/1982 | Levinstein | 148/DIG. 147 |
| 4,356,040 | 10/1982 | Fu et al. | 148/1.5 |
| 4,443,930 | 4/1984 | Hwang et al. | 29/571 |
| 4,458,410 | 7/1984 | Sugaki et al. | 29/578 X |
| 4,471,524 | 9/1984 | Kinsbron et al. | 148/187 X |
| 4,477,310 | 10/1984 | Park et al. | 29/578 X |
| 4,485,550 | 12/1984 | Koeneke et al. | 148/187 X |
| 4,510,670 | 4/1985 | Schwabe et al | 357/67 S |
| 4,528,744 | 7/1985 | Shibata | 29/578 X |

OTHER PUBLICATIONS

Park et al., "Mo/Ti Bilayer Metallization-TiSi$_2$ Process", J. Vac. Sci. Technol. A2(2) Apr.-Jun. 1984, pp. 259-263.
Jones et al, "Salicide with Buried Silicide Layer", I.B.M. Tech. Discl. Bull., vol. 27, No. 2, Jul. 1984, pp. 1044-1045.
Choi et al., "Improved Salicide Process-Silicide Formation", I.B.M. Tech. Discl. Bull., vol. 27, No. 7B, Dec. 1984, pp. 4402-4404.

*Primary Examiner*—William G. Saba
*Attorney, Agent, or Firm*—Eugene H. Valet; Patrick T. King

[57] ABSTRACT

A method for constructing titanium silicide integrated circuit gate electrodes and interconnections is disclosed. The method finds particularly useful applications in metal-oxide semiconductor integrated circuit fabrication. Following standard active and passive circuit component construction, a thin film of titanium is overlayed on the die structure covering thereby the pre-patterned polysilicon gates and interconnections. The die is then rapidly heated and baked to form a silicide layer superposing said polysilicon. The undesired titanium layer over other areas can be stripped using simple ammonium hydroxide/hydrogen etching and cleaning solution. Titanium silicide electrodes and interconnections are self-aligned and have a sheet resistance of 1 to 5 ohms per square.

5 Claims, 7 Drawing Figures

METHOD OF FABRICATING TITANIUM SILICIDE GATE ELECTRODES AND INTERCONNECTIONS

BACKGROUND OF THE INVENTION

1. Field of the Invention

The present invention generally relates to integrated circuits and, in particular, to a method for constructing titanium silicide metal-oxide semiconductor (MOS) integrated circuit electrodes and in interconnections.

2. Description of the Related Art

Field-effect transistors (FET) and other related insulated-gate electronic devices are mainstay components of MOS integrated circuits. A MOSFET generally consists of two closely spaced, doped regions in a substrate—the "source" and the "drain." The region between the two is the "channel." A thin insulation layer is formed directly above the channel. A conductive material "gate" electrode is positioned directly over and completely covering the insulation layer directly above the channel. A voltage applied to the gate affects the electronic properties of the channel region, whereby the FET is turned ON or OFF.

In some devices, such as the electrically erasable programmable read only memory (EEPROM or E2-PROM) device, a first gate lies below a superposing insulator layer upon which the gate electrode is constructed; the first gate is known as a "floating gate."

The abbreviation "MOS" has become somewhat of a misnomer because for many applications these gates are formed of a polysilicon material which is doped to render it conductive. However, although such a gate is adequate to create a field in the channel region so as to control the state of the FET, it is not without its operational problems.

One of these problems is that polysilicon has a relatively high sheet resistance and, therefore is not as good a conductor as metal. This, of course, results in slower devices. Hence, manufacturers of integrated circuits have taken to forming composite metal silicide electrodes and interconnections between circuit components. See e.g., U.S. Pat. No. 4,337,476 (Fraser and Murarka).

Hwang, et al., U.S. Pat. No. 4,443,930 teaches a method of cosputtering a target of metal silicide and a target of doped silicon to form a low sheet resistance conductor. However, direct deposit and etching techniques such as this have the disadvantage in that there are difficulties of defining the pattern and creating unstable transistors. See also, U.S. Pat. No. 4,332,839 (Levinstein, et al.).

Another method of fabricating a metal silicide structure is to form a high resolution pattern prior to depositing a metal silicide layer and then lifting the pattern to leave an electrode/interconnection pattern. See U.S. Pat. No. 4,362,597 (Fraser et al.). Directly deposited polycide (silicide on polysilicon) gates and interconnections have difficulties in defining and controlling the line widths.

One recent solution is proposed by Scovell, et al., U.S. Pat. No. 4,468,308, in which a metallic silicide layer is formed on a substrate by pulse heating deposits to cause interdiffusion.

A major problem of prior techniques occurs in the etching of such a blanket titanium silicide layer to leave only the desired electrodes and interconnections. The silicide will etch at a different rate than adjacent or sandwiched silicon or polysilicon layers. Hence, there exists a tendency to leave silicide which overhangs such layers. When depositing further layers of the structure, such overhangs create flow problems, leaving holes or air bubbles in the structure.

No simple process has been developed which will create a self-aligned, discrete pattern of metal silicide suitable for the geometries involved in the fabrication of integrated circuits.

SUMMARY OF THE INVENTION

Wherefore, it is an object of the present invention to provide a method for fabricating metal silicide gate electrodes and integrated circuit interconnections.

It is another object of the present invention to form a silicide pattern on an integrated circuit which is self-aligned on top of polysilicon layers.

It is a further object of the present invention to form silicide gate electrodes and integrated circuit interconnections which have a low sheet resistance.

It is yet a further object of the present invention to form a silicide which can be patterned using conventional etching techniques to obtain gate electrodes and interconections.

In its broad aspect, the present invention provides a method of forming metal silicide electrode and/or metal silicide interconnection structures on an integrated circuit substrate, having circuit components and patterned polysilicon layers superposing the surface of said substrate, by forming a thin film of metal on said substrate to form a stratified structure with said polysilicon layer, rapidly heating said substrate, and baking said substrate such that said metal and said polysilicon react to form a substantially homogenous metal silicide layer, wherein said metal silicide layer forms a pattern of metal silicide electrode and metal silicide interconnection structures.

Other objects, features and advantages of the present invention will become apparent upon consideration of the following detailed description and the accompanying drawings, in which like reference designations represent like features throughout the FIGURES.

DETAILED DESCRIPTION OF THE INVENTION

Reference is now made in detail to a specific embodiment of the present invention, which illustrates the best mode presently contemplated by the inventors for practicing the invention. Alternative embodiments are also briefly described. The drawings referred to in this description are to be understood not to be drawn to scale except if specifically noted. Moreover, the drawings are intended to illustrate only one portion of an integrated circuit fabricated in accordance with the present invention.

The process of the present invention begins with a commercially available silicon wafer which defines a silicon substrate 10 for the integrated circuit being fabricated. Before forming the metal silicide gate electrodes and interconnection structures, the circuit components are constructed in accordance with well-known integrated circuit fabrication techniques. To illustrate the present invention, a section of an integrated circuit substrate 10 is shown with two such devices, one a single gate device 11 and the other a double gate device 13 as may be constructed, for example, for an EPROM cell.

The details of the common steps as shown in completion in the FIGURES can be found in many classical integrated circuit fabrication texts; one such is by the Fairchild Corporation, entitled, *Semiconductor & Integrated Circuit Fabrication Techniques*, Reston Publishing Company, Inc., Copyright 1979.

Figure 1:
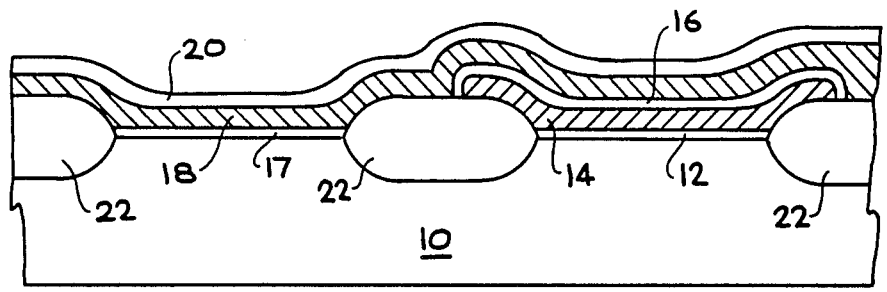
FIGS. 1 through 7 are cross-sectional drawings showing an idealized sequence of process steps for select exemplary integrated circuit components having electrodes and interconnections formed by the method according to the present invention.

FIG. 1 shows the substrate 10 at the completion of several steps accomplished preparatory to forming transistor gates. An insulator layer (not shown) has been formed over the substrate 10; typically a silicon dioxide layer is formed by thermal oxidation of the substrate 10 in an oxidizing atmosphere at an elevated temperature. The thickness is not critical and is often in the range of 200 to 1,000 Angstroms. A layer of a different insulator, such as silicon nitride (not shown), is then formed, usually by chemical vapor deposition (CVD). A common photoresist mask technique is then used to create a pattern in the nitride. Thick isolating field oxide regions 22 are then grown. Next, a gate oxide layer 12 is formed, again such as by thermal growth. These techniques are well known.

Through similar well-known steps a first polysilicon layer 14 is formed (aka Poly I) and patterned; an intergate oxide layer 16 is formed and patterned on polysilicon layer 14 above the region where the EPROM cell 13 is to be constructed and/or on the substrate 10, layer 17 is formed to be used for a single gate device 11; another polysilicon layer 18 is formed (aka Poly II); and a layer of silicon nitride 20 is formed. For this embodiment, the nitride layer is commonly formed in a thickness having a range of 700 to 1500 Angstroms.

Figure 2:
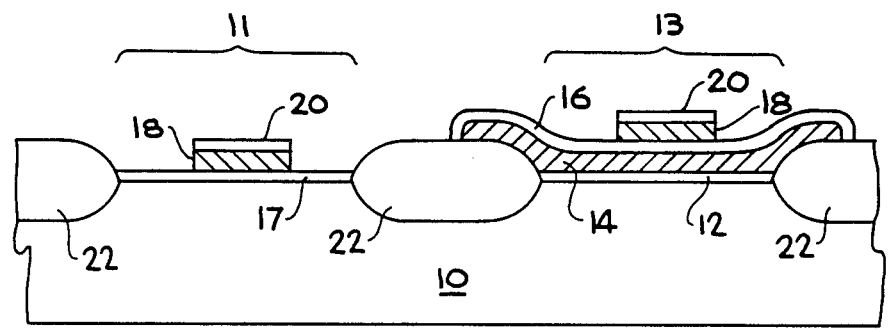

Photoresist is then patterned using conventional photolithographic techniques and conventional plasma etching can be used to pattern the nitride 20 and the Poly II 18 as shown in FIG. 2.

Figure 3:
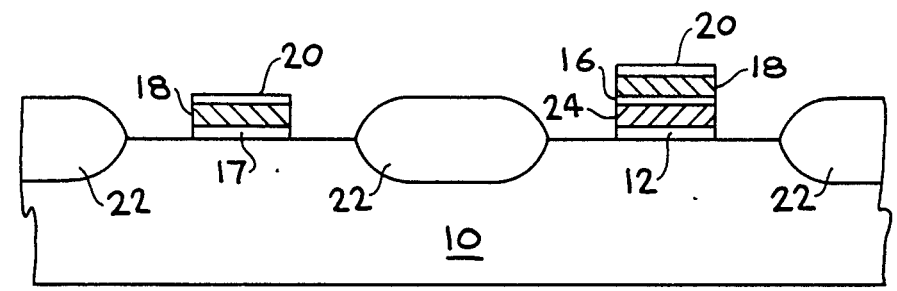

Referring to FIG. 3, using conventional double gate formation techniques, the interoxide layer 16 has been dipped out except between the Poly I 14 and the Poly II 18. Commonly known etching can be used to form a self-aligned floating gate 24 for the double gate EPROM structure 13.

Figure 4:
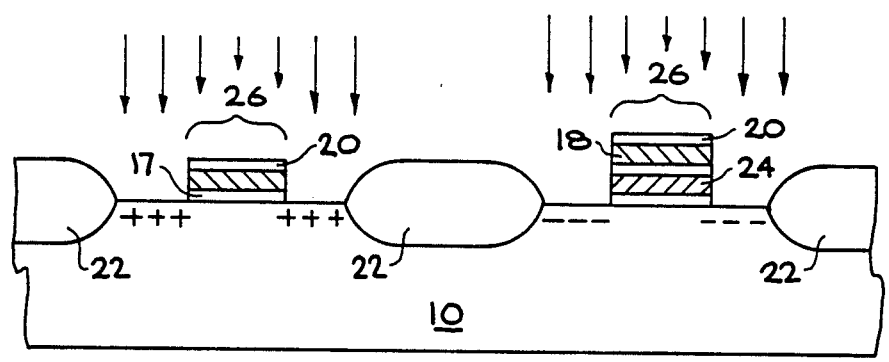

FIG. 4 illustrates the structure at step completion following the doping of regions of the substrate on each side of the single gate structure 26 and each side of the double gate structure 28 to form source and drain regions of the FETs 11, 13 in the substrate 10.

There is no physical distinction between the drain and source regions in a MOSFET because of the inherent symmetry of the structure. Rather, the biasing conditions generally determine which region is considered the source and which region is considered the drain. For clarity of explanation of the preferred embodiment of the present invention, the source regions are designated 30 and the drain regions are designated 32 arbitrarily.

For an n-channel type MOSFET, the dopant ions most commonly used are arsenic or phosphorous ions; for a p-channel type MOSFET, the dopant ions most commonly used are boron ions. One example of a common technique for forming the source 30 and drain 32 is ion implantation where the ions are introduced into the substrate 10 with an implant energy of approximately 30 to 150 kev to form impurity concentrations of about $10^{20}$ atoms per cubic centimeter.

The next step of the process is to grow thermally another oxide layer 34 on the surface of substrate 10 above the source 30 and drain 32 regions and around the sides of the gates 18, 24, 36. The thickness of this oxide layer is approximatley 500 to 1500 Angstroms. Hot phosphoric acid is then used to remove the remaining nitride layers 20 from the top surface of the gate 36 and the gate 18. Conventional methods are employed in these steps to achieve the structure as shown in FIG. 5.

Figure 5:
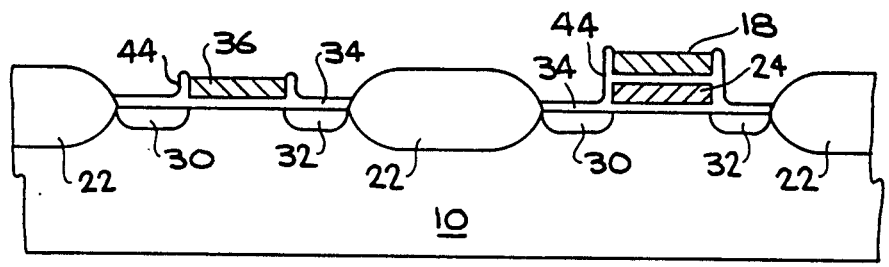
Figure 6:
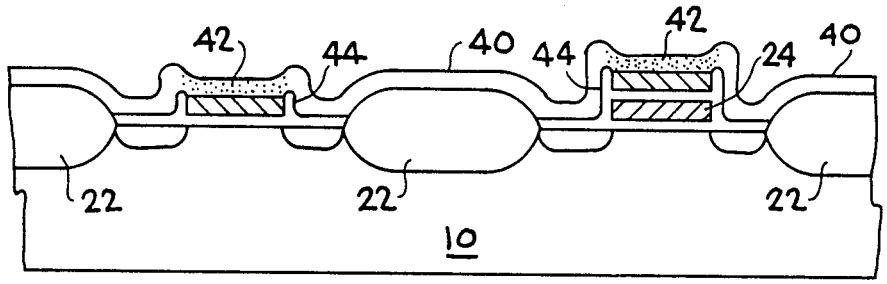
Figure 7:
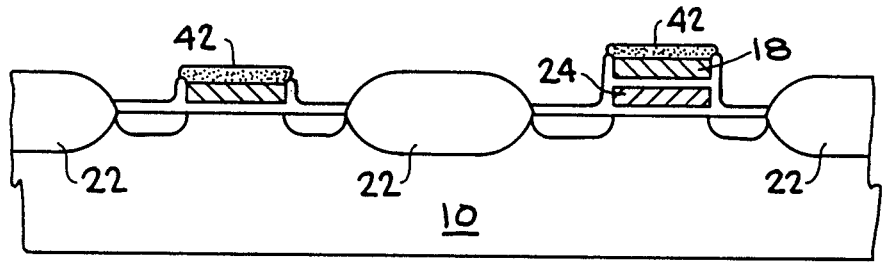

The key to the present invention lies in the next fabrication steps represented in completion phase by FIG. 6. A thin film of titanium 40 is deposited across the top surface of the die, represented by the structure of FIG. 5. In the preferred embodiment, commercial sputtering equipment was used to obtain a film having a thickness of approximately 500 to 1500 Angstroms.

The structure formed to this point in the process is then rapidly heated (within 30 seconds) to a temperature having a range of approximately 500 to 800 degrees centigrade. One method of rapidly raising the temperature is to subject the structure to the radiation of a tungsten halogen lamp in a non-oxidizing ambient atmosphere, such as argon. The structure is then allowed to bake for a time sufficient to allow the titanium to react with the underlying layer of polysilicon, viz. the gates 18,36. It has been determined that a period in the range of one to thirty seconds suffices to form a substantially homogeneous titantium silicide alloy layer 42 superposing the gate layers 18, 36. The titanium silicide gate electrodes 42 formed in accordance with this procedure have a sheet resistance of approximately one to five ohms per square.

Note that the areas of the surface of the structure coated with the thermal oxide of the previous steps (as shown in FIG. 5) are not converted during the baking to silicide. A layer of substantially pure titanium 40 remains as previously deposited. A standard ammonia hydroxide/hydrogen peroxide solution stripping of this titanium 40 can be readily accomplished. It is important to further note that the sidewalls 44 of the thermal oxide 34 acts to reduce the thickness of the titanium on the sidewalls 44. This prevents silicon from moving out of the Poly I and Poly II lines during the heating and baking to form unwanted titanium silicide formations in the circuit, viz. other than as electrodes and interconnections as determined by the mask applied prior to the stripping. This clean edge definition is important to establishing optimal operational parameters for the entire integrated circuit device.

Standard fabrication techniques can next be used to deposit standard remaining layers necessary to finalize the particular integrated circuit device, such as further insulation, metallization, and passivation layers. The method of the present invention also prevents holes from being left in the structure during the construction of these subsequent layers.

Hence, a novel technique for creating a self-aligned structure having a discrete pattern of gate electrodes and interconnections formed of titanium silicide has been invented which takes advantage of basic and well understood fabrication techniques wherever possible to simplify integrated circuit construction while providing improved performance devices.

The foregoing description of the preferred embodiment of the present invention has been presented for the purpose of illustration and description. It is not intended to be exhaustive or to limit the invention to the precise form disclosed. As should be obvious to one skilled in the art, many modifications and variations—e.g., a different sequence of the steps of any method presented or the application to the construction of many NMOS, PMOS, or CMOS circuits—are possible in light of the above teaching. The embodiment was chosen and described in order to explain the principles of the invention and its practical application to thereby enable others skilled in the art and having express permission directly from the inventor, or his assigns, to best utilize the invention in various embodiments and with various modifications as are suited to the particular use contemplated. It is intended that the scope of the invention be defined by both the claims appended hereto and their equivalents.

What is claimed is:

1. An improved method of forming metal silicide electrode and interconnection structures on an integrated circuit substrate having a patterned polysilicon layer superposing said substrate and circuit components, characterized by the steps of:

depositing a film of titanium having a thickness in the approximate range of 500 to 1500 Angstroms;

rapidly raising the temperature of said substrate to within the approximate range of 500 to 800 degrees centigrade;

maintaining said temperature for only a period of time sufficient for said titanium to react with only said polysilicon, said period of time being within the approximate range of one second to 30 seconds such that said metal and said polysilicon react to form a silicide layer.

2. In a method of forming a semiconductor integrated circuit device having a silicon substrate, an improved method of forming transistor structures having metal silicide gate electrodes and metal silicide interconnections on said semiconductor integrated circuit silicon substrate characterized by the steps of:

forming a first insulator layer over said silicon substrate;

forming at least one polysilicon gate on said first layer;

doping regions of said substrate on each side of said gate such that said dopant forms source, drain and channel regions with respect to said gate to create a transistor structure;

thickening said first insulating layer not covered by said gate to a thickness so as to surround said gate;

depositing a film of titanium having a thickness in the approximate range of 500 to 1500 Angstroms;

rapidly raising the temperature of said substrate to within the approximate range of 500 to 800 degrees centigrade;

maintaining said temperature for only a period of time to allow said titanium and only said polysilicon to react so as to form a titanium silicide gate electrode superposing said channel region said period of time being within the approximate range of one second to 30 seconds; and stripping said titanium layer from said first insulator layer.

3. The method as set forth in claim 2, further comprising:

forming a plurality of said transistor structure.

4. The method as set forth in claim 3, further comprising:

forming a pattern of polysilicon interconnections between said transistors prior to said step of thickening said insulator layer such that said layer also surrounds said interconnections.

5. The method according to claim 4, wherein said substrate has active integrated circuit components integral therewith, further comprising:

patterning said interconnections such that said transistors are connected to at least some of said components.

* * * * *